United States Patent
Strijker

(10) Patent No.: US 10,587,184 B2
(45) Date of Patent: Mar. 10, 2020

(54) CHARGE PUMP CIRCUIT DRIVING A LOAD CONNECTION SWITCH

(71) Applicant: NXP B.V., Eindhoven (NL)

(72) Inventor: Joan Wichard Strijker, Wijchen (NL)

(73) Assignee: NXP B.V., Eindhoven (NL)

( * ) Notice: Subject to any disclaimer, the term of this patent is extended or adjusted under 35 U.S.C. 154(b) by 407 days.

(21) Appl. No.: 15/396,539

(22) Filed: Dec. 31, 2016

(65) Prior Publication Data

US 2017/0207694 A1    Jul. 20, 2017

(30) Foreign Application Priority Data

Jan. 15, 2016    (EP) .................................... 16151503

(51) Int. Cl.
*H02M 1/36* (2007.01)
*H02M 1/08* (2006.01)
(Continued)

(52) U.S. Cl.
CPC ............. *H02M 1/36* (2013.01); *H02J 7/0052* (2013.01); *H02M 1/08* (2013.01); *H02M 3/07* (2013.01); *H02M 3/073* (2013.01); *H03K 17/063* (2013.01); *B60L 58/12* (2019.02); *B60L 58/16* (2019.02); *G01R 31/367* (2019.01); *G01R 31/382* (2019.01); *G01R 31/392* (2019.01); *H01M 10/48* (2013.01);
(Continued)

(58) Field of Classification Search
CPC ................................ H02M 1/36; H02J 7/0052
USPC ........................................................ 320/107
See application file for complete search history.

(56) References Cited

U.S. PATENT DOCUMENTS 6,256,482 B1 * 7/2001 Raab ..................... H03F 1/0227
                                                                        330/199
6,347,029 B1    2/2002 Ouyang et al.
(Continued)

FOREIGN PATENT DOCUMENTS

CN        102780408 A    11/2012
CN        203747400 U     7/2014
(Continued)

OTHER PUBLICATIONS

Extended European Search Report for Patent Appln. No. 16151503.6 (dated Jun. 29, 2016).
(Continued)

*Primary Examiner* — David V Henze-Gongola
*Assistant Examiner* — Tarikh Kanem Rankine

(57) ABSTRACT

A secondary side controller for a switched mode power supply, the controller comprising
a first semiconductor die comprising an integrated circuit configured to provide a load connection signal;
a second semiconductor die, packaged with the first semiconductor die, comprising a charge pump configured to, in response to the load connection signal received from the integrated circuit of the first semiconductor die, provide a switch signal for control of a load connection switch that controls whether or not the switched mode power supply is electrically connected to a load;
wherein the presence or absence of the load connection signal is configured to control whether or not the charge pump generates the switch signal and the amplitude of the load connection signal is configured to control the voltage of the switch signal.

10 Claims, 3 Drawing Sheets

US 10,587,184 B2

Page 2

(51) Int. Cl.
*H02M 3/07* (2006.01)
*H02J 7/00* (2006.01)
*H01M 10/48* (2006.01)
*B60L 58/16* (2019.01)
*G01R 31/367* (2019.01)
*G01R 31/392* (2019.01)
*B60L 58/12* (2019.01)
*G01R 31/382* (2019.01)
*H03K 17/06* (2006.01)
*H02M 3/156* (2006.01)
*H02M 3/335* (2006.01)

(52) U.S. Cl.
CPC ......... *H01M 10/486* (2013.01); *H02J 7/0021* (2013.01); *H02J 2007/0059* (2013.01); *H02J 2007/0062* (2013.01); *H02M 3/156* (2013.01); *H02M 3/335* (2013.01); *H02M 2003/076* (2013.01); *H03K 2217/0054* (2013.01); *H03K 2217/0081* (2013.01); *Y02T 10/7005* (2013.01); *Y02T 10/7044* (2013.01)

(56) References Cited

U.S. PATENT DOCUMENTS

| | | | | |
|---|---|---|---|---|
| 8,183,931 | B2* | 5/2012 | Lesso | H02M 3/07 327/536 |
| 9,484,758 | B2* | 11/2016 | Chen | H02J 7/0052 |
| 2002/0057082 | A1* | 5/2002 | Hwang | H02M 3/158 323/284 |
| 2003/0138112 | A1* | 7/2003 | Doy | H03F 3/005 381/74 |
| 2004/0085052 | A1* | 5/2004 | Itabashi | H02M 1/36 323/282 |
| 2004/0217750 | A1* | 11/2004 | Brown | G06F 1/263 323/299 |
| 2005/0174815 | A1* | 8/2005 | Chen | H02M 3/073 363/60 |
| 2005/0184807 | A1* | 8/2005 | Doy | H03F 1/0211 330/297 |
| 2008/0048618 | A1 | 2/2008 | Melanson | |
| 2008/0129372 | A1* | 6/2008 | Rozsypal | H02M 3/07 327/536 |
| 2009/0121702 | A1* | 5/2009 | Li | H02M 1/08 323/351 |
| 2009/0154733 | A1* | 6/2009 | Lesso | H02M 3/07 381/120 |
| 2009/0256625 | A1* | 10/2009 | Jung | H03K 5/08 327/536 |
| 2011/0019446 | A1* | 1/2011 | Wu | H02M 3/33523 363/79 |
| 2012/0212293 | A1* | 8/2012 | Khlat | H03F 1/0227 330/127 |
| 2012/0287684 | A1 | 11/2012 | Fahlenkamp | |
| 2012/0287685 | A1 | 11/2012 | Fahlenkamp | |
| 2013/0093381 | A1* | 4/2013 | McGinley | H02J 7/0068 320/107 |
| 2013/0106374 | A1* | 5/2013 | Ball | H02M 3/1588 323/271 |
| 2013/0200943 | A1 | 8/2013 | Vilas Boas et al. | |
| 2014/0152388 | A1* | 6/2014 | Lesso | H02M 3/07 330/279 |
| 2014/0266410 | A1 | 9/2014 | Wang | |
| 2015/0295494 | A1* | 10/2015 | Gong | H05B 33/0815 315/224 |
| 2015/0311783 | A1* | 10/2015 | Saadat | G05F 1/577 323/267 |
| 2016/0211816 | A1* | 7/2016 | Lesso | H02M 3/07 |

FOREIGN PATENT DOCUMENTS

| | | |
|---|---|---|
| EP | 0 559 996 A1 | 9/1993 |
| EP | 2 717 449 A1 | 4/2014 |

OTHER PUBLICATIONS

Wei, Kang Cheng et al; "Design of a Low Voltage Charge Pump circuit for RFID Tag"; Proceedings of the 2012 IEEE-ICSE, Kuala Lumpur, Malaysia; pp. 466-469 (2012).

Wong, Oi-Ying et al; "A Low-voltage Charge Pump with Wide Current Driving Capability"; 2010 IEEE International Conference of Electron Devices and Solid-State Circuits; 4 pages (2010).

* cited by examiner

CHARGE PUMP CIRCUIT DRIVING A LOAD CONNECTION SWITCH

CROSS-REFERENCE TO RELATED APPLICATIONS

This application claims the priority under 35 U.S.C. § 119 of European patent application no. 16151503.6, filed Jan. 15, 2016 the contents of which are incorporated by reference herein.

The present disclosure relates to a secondary side controller for a switched mode power supply. In particular, it relates to a secondary side controller configured to control a load disconnection switch arranged at an output of the switched mode power supply for controlling when the output of the switched mode power supply is applied to a load connected thereto. The present disclosure also relates to a switched mode power supply including the controller and a Universal Serial Bus (USB) based charger. The present disclosure also relates to a method of controlling a load connection switch of a switched mode power supply, the load connection switch configured to provide for connection or disconnection of an output of the switched mode power supply to a load connected to the switched mode power supply.

According to a first aspect of the present disclosure there is provided a secondary side controller for a switched mode power supply, the controller comprising
 a first semiconductor die comprising an integrated circuit configured to provide a load connection signal;
 a second semiconductor die, packaged with the first semiconductor die, comprising a charge pump configured to, in response to the load connection signal received from the integrated circuit of the first semiconductor die, provide a switch signal for control of a load connection switch that controls whether or not the switched mode power supply is electrically connected to a load;
 wherein the presence or absence of the load connection signal is configured to control whether or not the charge pump generates the switch signal and the amplitude of the load connection signal is configured to control the voltage of the switch signal.

In one or more embodiments the load connection signal comprises a plurality of pulses, said pulses configured to control the charging and discharging of at least one capacitor of the charge pump in order to provide the switch signal.

In one or more embodiments the charge pump is configured to apply a voltage derived from the amplitude of the load connection signal to the at least one capacitor in accordance with the pulses.

In One or more embodiments the charge pump includes at least one driver amplifier having an input terminal, an output terminal and a power supply terminal, the input terminal configured to receive the load connection signal, the output terminal connected to the at least one capacitor, and wherein the application of the load connection signal at the input terminal is configured to charge and discharge the capacitor, and a driver supply voltage applied to the power supply terminal is based on the amplitude of the load connection signal.

In one or more embodiments the charge pump is configured to receive a controller supply voltage and the switch signal comprises a voltage based on the controller supply voltage and the voltage across the at least one capacitor.

In one or more embodiments the charge pump comprises a supply block for providing the driver supply voltage to the power supply terminal of the driver amplifier, the supply block comprising a differential amplifier configured to receive the load connection signal at its positive terminal and provide an output to a gate of a transistor, a source and drain terminal of the transistor connected to a supply voltage terminal configured receive a controller supply voltage provided to the controller and the power supply terminal of the driver amplifier respectively, a second power supply terminal of the driver amplifier connected to a reference voltage, a negative terminal of the differential amplifier connected to a node between the transistor and the driver amplifier.

In one or more embodiments the charge pump includes at least a first stage driver amplifier and a second stage driver amplifier, each of the first and second driver amplifiers configured to receive the load connection signal at their input and provide an output to a respective capacitor, the voltage across the capacitors, in combination with a controller supply voltage providing the switch signal, and wherein the each of the first and second driver amplifiers are configured to receive a driver supply voltage and their respective power supply terminals derived from the load connection signal.

In one or more embodiments the integrated circuit is configured to determine the amplitude of the load connection signal based on the voltage output of the power supply.

In one or more embodiments the charge pump includes an output arrangement configured to receive the voltage from the at least one capacitor and the controller supply voltage via a supply terminal and provide the switch signal at an output terminal of the controller, the output arrangement comprising a first current control element and a second current control element arranged in series, the first current control element configured to connect to the controller supply voltage and the second current control element configured to provide the switch signal, at least one capacitor connected to a node between the first and second current control elements, wherein the first and second current control elements comprise diodes or switches configured to prevent current flow from the capacitor towards the supply terminal.

In one or more embodiments the integrated circuit of the first semiconductor die is configured to control the application of the switch signal by provision of the load connection signal and to control the voltage of the switch signal by control of the amplitude of the load connection signal in response to the voltage output of the switched mode power supply.

According to a second aspect of the present disclosure there is provided a switched mode power supply including a load disconnection switch at an output of the switched mode power supply and configured to provide for connection of the output of the switched mode power supply to the load, the load connection switch comprising an NMOS based transistor wherein a gate terminal thereof is connected to a secondary side controller of the first aspect and configured to receive the switch signal for control of the load connection switch.

In one or more embodiments the switched mode power supply comprises a primary side and a secondary side connected by windings, the secondary side controller configured to provide a feedback signal to a primary side controller of the primary side for regulation of the voltage of the output of the switched mode power supply.

According to a third aspect of the present disclosure there is provided a Universal Serial Bus based charger for charging an electronic device including the controller of the first aspect or the switched mode power supply of the second aspect.

The secondary side controller may be configured to operate using the USB Power Delivery protocol or other charging protocol such as QuickCharge, USB Type-C and HiSilicon.

According to a fourth aspect of the present disclosure there is provided a method of controlling a load connection switch of a switched mode power supply, the load connection switch configured to provide for connection or disconnection of an output of the switched mode power supply to a load connected to the switched mode power supply, comprising, providing a load connection signal to a charge pump for providing a switch signal to the load connection switch, wherein the presence or absence of the load connection signal is configured to control whether or not the charge pump generates the switch signal and the amplitude of the load connection signal is configured to control the voltage of the switch signal.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which:

BRIEF DESCRIPTION OF DRAWINGS

FIG. 1 shows a switched mode power supply 100 configured to provide power for a USB based charger. It will be appreciated that the supply 100 may provide power for other devices or applications. The supply 100 includes a secondary side controller 101 and a load disconnection switch 102. The secondary side controller is configured to provide a switch signal for actuation of the load disconnection switch 102. The load disconnection switch 102 is arranged in series with the voltage output 103 of the supply 100 and an output terminal 104. The voltage output 103 may be the positive voltage output of the supply 100. The output terminal 104, a reference terminal (ground, for example) 105 and two data terminals 106, 107, may be arranged together to form a USB connecter terminal 108. In this example, the secondary side controller 101, in addition to controlling the load disconnection switch 102, is configured to regulate the voltage output of the supply 100. The controller 101 may also provide for data exchange with the load to provide for load-requested voltage output levels and control the supply accordingly. Thus, in FIG. 1, the secondary side controller 101 is shown receiving data lines 110, 111 from the data terminals 106, 107 and providing a feedback signal 112 to the remainder of the supply 100. It will be appreciated in other embodiments the additional functions described above may be provided by the present controller 101 or a different controller. The controller 101 also includes a controller supply voltage input 113 configured to receive a supply voltage derived from the output 103 of the supply 100, a ground connection 114 (or a connection to another reference voltage) and a switch signal output 115 application of a switch signal to the load disconnection switch 102.

Figure 1:
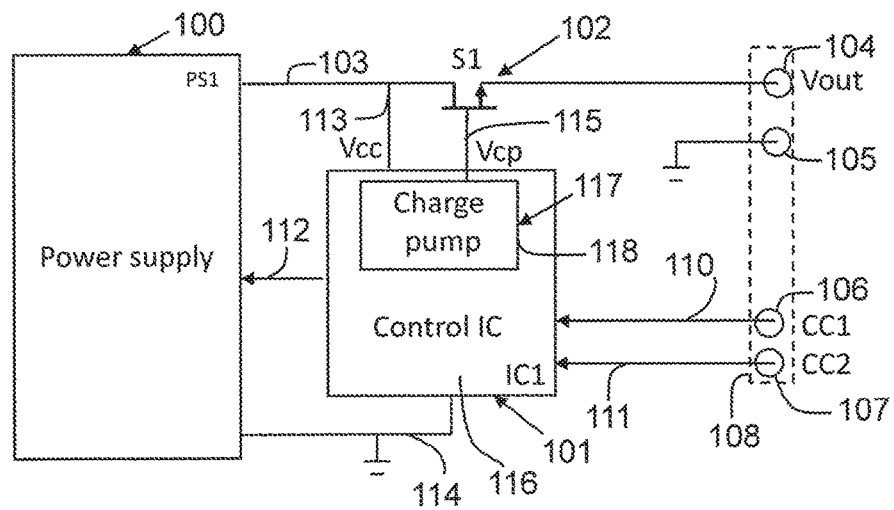
FIG. 1 shows an example embodiment of a secondary side controller arranged in situ on a secondary side of a switched mode power supply.

The load disconnection switch 102 in this example comprises an NMOS based transistor switch. The use of a NMOS based transistor switch is advantageous (such as over a PMOST based switch) because they may be die area efficient and have low on-state resistance. In order to effectively control an NMOS based transistor switch which is configured to control the output voltage of the supply 100, the voltage of the switch signal applied at a gate terminal of the NMOS switch must be higher, such as at least 3, 4 or 5 Volts higher than the supply voltage provided by the supply 100 at a source terminal of the NMOS switch.

If USB charger is of USB-PD (Power Delivery) type, the switched mode power supply may be configured to output voltages of up to 20 Volts and therefore the controller may need to provide a voltage, to the gate terminal of the NMOS transistor load disconnection switch, of at least 25 Volts or at least 30 Volts.

The controller 101 comprises a first semiconductor die 116 which may include an integrated circuit, such as a microcontroller or microprocessor, and a second semiconductor die 117 comprising a charge pump 115 for generating a switch signal of an appropriate voltage for controlling the load disconnection switch 102. The first semiconductor die 116 and the second semiconductor die 117 are mounted within a single package to form the secondary side controller 101. The integrated circuit of the first semiconductor die may be fabricated using a high density integrated circuit process, such as CMOS14 or CMOS090. The charge pump of the second semiconductor die may be fabricated using a semiconductor fabrication process, such as A-BCD2 or A-BCD3. The integrated circuit of the first semiconductor die 116 is configured to generate a load connection signal for controlling when the supply voltage at 103 is applied to the load connected to terminal 104. The integrated circuit may be configured to provide the load connection signal based on the data received at one or both data lines 110, 111 or based on other parameters such as due to error conditions where the load disconnection switch will be opened by the controller to protect the connected phone, tablet or other load from being damaged. The integrated circuit may also be configured to determine what voltage the switch signal is required to be in order to operate the load disconnection switch 102. This voltage may be set dependent on the characteristics of NMOST 102. For example, a logic level type NMOST has a low threshold voltage so requires a lower Vcp signal to drive it to its lowest RdsOn. For example, 4-5V is enough. Further, normal level MOSFETS may require about 8V.

In this embodiment, the integrated circuit is configured to provide a modulated load connection signal to the charge pump 118, wherein the presence or absence of the load connection signal is configured to control whether or not the charge pump 118 generates the switch signal 115 and the amplitude of the load connection signal is configured to control the voltage of the switch signal 115. This may be advantageous as the integrated circuit may only require one bond wire to instruct the charge pump when to provide the switch signal and the required magnitude of the switch signal. The charge pump 118 is further configured to receive the modulated load connection signal and provide the switch signal with the instructed voltage level, as Will be described in more detail below.

Figure 2:
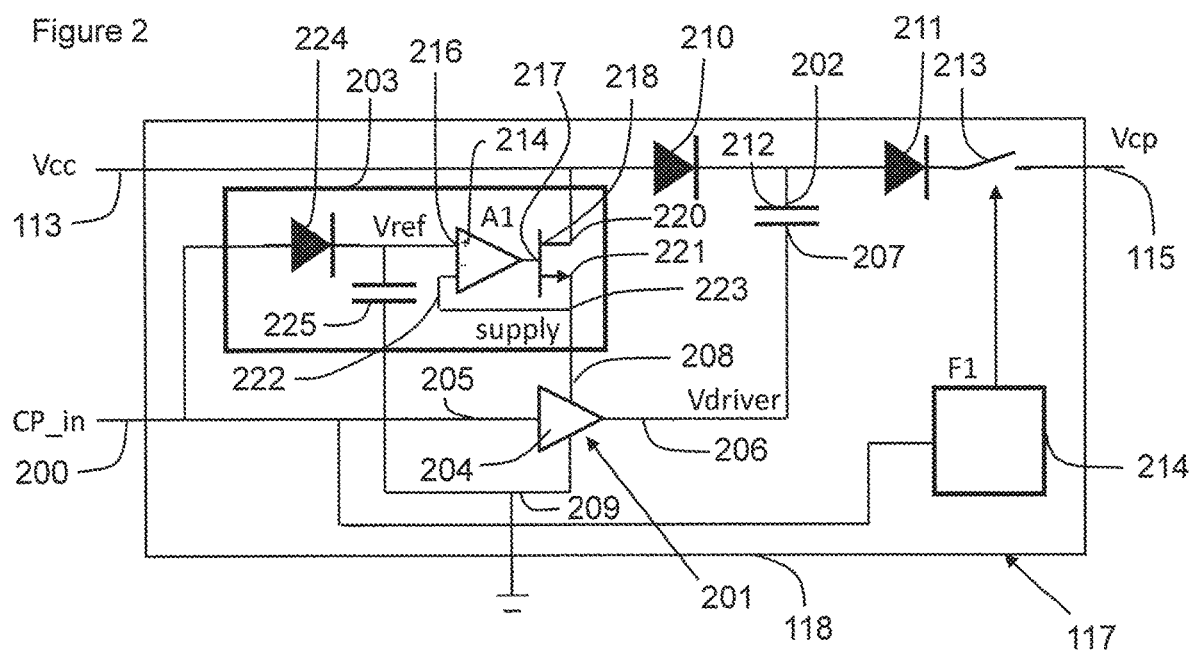
FIG. 2 shows an example charge pump arrangement.

FIG. 2 shows the second semiconductor die 117 and in particular, an example arrangement of the charge pump 118. The charge pump 118 is configured to receive a controller supply voltage 113, Vcc, derived from the output 103 of the supply 100; a connection to ground 114 (or other reference voltage); the load connection signal 200, CP_in, received from the integrated circuit of the first semiconductor die 116; and provide the switch signal 115, Vcp. Each of the controller supply voltage 113 and the ground connection may be provided either directly or via the first semiconductor die 116. The connections to and from the second semiconductor die 117 may be provided by bondwires.

The load connection signal may comprise a series of pulses wherein the presence or absence of the series of pulses provides for control of whether the load disconnection switch is open or closed and the amplitude of the pulses provides for control of the voltage of the switch signal.

The charge pump 118 includes a first part 201 configured to use the pulses of the load connection signal to control the charging and discharging of a capacitor 202 (or other energy storage element) and a second part 203 configured to use the amplitude of the load connection signal to control the voltage to which the capacitor is charged, in particular, the first part 201 may comprise a driver amplifier 204 having its input 205 connected to the load connection signal and its output 206 to a first terminal 207 of the capacitor 202. The second part 203 may comprise a driver voltage supply block configured to provide power to the driver amplifier at a first power terminal 208. A second power terminal 209 may be connected to a reference voltage, such as ground.

The voltage of the switch signal Vcp is provided by the controller supply voltage Vcc and the voltage of the capacitor 207 due to the charging thereof by the driver amplifier 204. Accordingly, a switch signal output arrangement comprising a first diode 210 configured to receive the controller voltage supply Vcc at an anode thereof and connect to a second diode 211 by its cathode. The first and second diodes in series with the one another and arrange to pass current in the same direction. The cathode of the second diode is connected to the switch signal output 115. A second terminal 212 of the capacitor 207 is connected to a node between the cathode of the first diode 210 and the anode of the second diode 211. The switch signal output arrangement may further include an output switch 213 between the switch signal output 115 and the second diode 211. The output switch 213 may be controlled by a driver circuit 214, which receives the load connection signal CP_in. This driver circuit closes switch 213 when a signal is present on CP_in.

In other examples, the first diode 210 and the second diode 211 may be replaced by active switches controlled by the driver signal. When the driver signal Vdriver is low, the switch that replaces diode 210 is closed and the switch that replaces diode 211 is open, so capacitor 212 is charged to a voltage equal to the Vcc voltage. Then, when the driver signal is high (Vdriver=Vsupply=Vref=Vpeak(Cp_in)), the switch that replaces diode 210 is opened and the switch that replaces diode 211 is closed. The energy in capacitor 212 is then transferred to the output 115 (Vcp). It will be appreciated that because typically the gate capacitance of the active switches is typically much higher than the charge pump capacitor 212, one switching cycle of the Vdriver signal only raises the Vcp voltage by a relatively small amount (such as about the ratio of the capacitance 212 divided by the gate capacitance times the driver voltage). Therefore, if the gate capacitance of the active switches is 1 nF and the capacitor 202 is 10 pF and Vref=3V, the voltage step for one cycle is 10 pF/1 nF*3V=30 mV. In one or more examples, the charge pump is running at substantially 1 MHz and the output voltage Vcp steps up quickly and after many switching cycles reaches the stable output voltage Vcc+Vref. The pulses drawn in FIG. 3 are just a few pulses shown for clarity and in other implementations many switching cycles are required to raise the voltage of the switch signal to the desired level (but then the frequency of the pulses is appropriately higher).

The driver amplifier 204 is configured to use the pulses of the load connection signal to periodically charge the capacitor 207 in accordance with the load connection signal. Given that the power supplied to the driver amplifier 204 is determined by the amplitude of the load connection signal, the charge pump 118 is able to control effectively the voltage of the switch signal.

The second part or driver voltage supply block 203 comprises a differential amplifier 214 configured to receive the load connection signal at its positive terminal 216 and provide an output to a gate 217 of a transistor 218. A source 220 of the transistor 218 is configured to be connected to the controller supply voltage Vcc and a drain terminal 221 of the transistor 218 is connected to the first power terminal 208 of the driver amplifier 204. A negative terminal 222 of the differential amplifier 214 is configured to receive a voltage from a node 223 between the transistor 218 and the driver amplifier 204. A diode 224 is provided having its anode configured to receive the load connection signal CP_in and its cathode connected to the positive terminal 218. A storage capacitor 225 is provided having a first plate connected to a node between the diode 224 and the positive terminal 216 and a second plate connected to ground (or other reference voltage). The storage capacitor is configured to store the peak voltage of CP_in during the moments CP_in is low.

Figure 3:
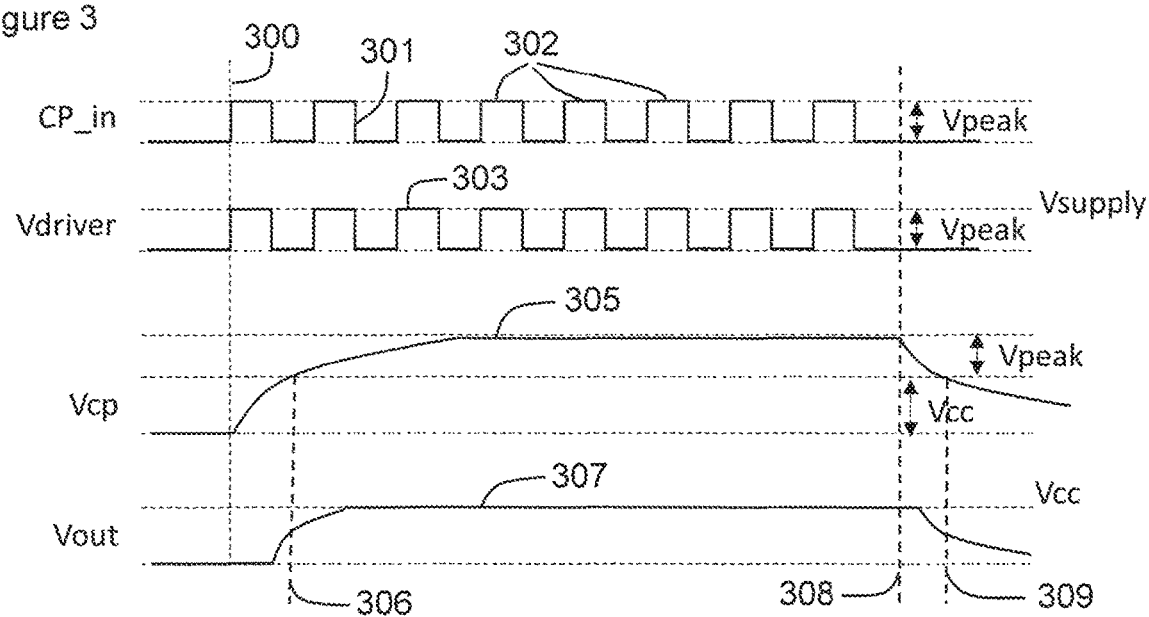
FIG. 3 shows a timing diagram illustrating a plurality of signals of the charge pump of FIG. 2 on receipt of a load connection signal.

FIG. 3 shows a timing diagram including various voltage/signals present in the charge pump 118. At time 300 the integrated circuit provides the charge pump with its amplitude modulated, load connection signal 301, designated CP_in. The load connection signal comprises a series or train of pulses 302, wherein the amplitude or voltage of the pulses, Vpeak, is provided to control the voltage applied to the load disconnection switch 102. The trace Vdriver 303 comprises the output of the driver amplifier 204 that is applied to the capacitor 202. As can be seen, the Vdriver signal comprises a series of pulses between a reference voltage (such as ground) and Vsupply having amplitude Vpeak. The trace Vcp 305 shows the switch signal that is output by the charge pump and applied to the load disconnection switch 102. At the time 300, the switch signal increases from the reference voltage to a voltage approaching Vcc+Vpeak, Once Vcp exceeds the supply voltage Vcc, at time 306, the load disconnection switch closes and the voltage Vout 307 at output terminal 104, increases to substantially Vcc. At time 308, the load connection signal 301 ceases and the switch signal Vcp output by the charge pump decreases. When the voltage of Vcp substantially fans below Vcc at time 309, the load disconnection switch 102 opens thereby disconnecting the load.

Figure 4:
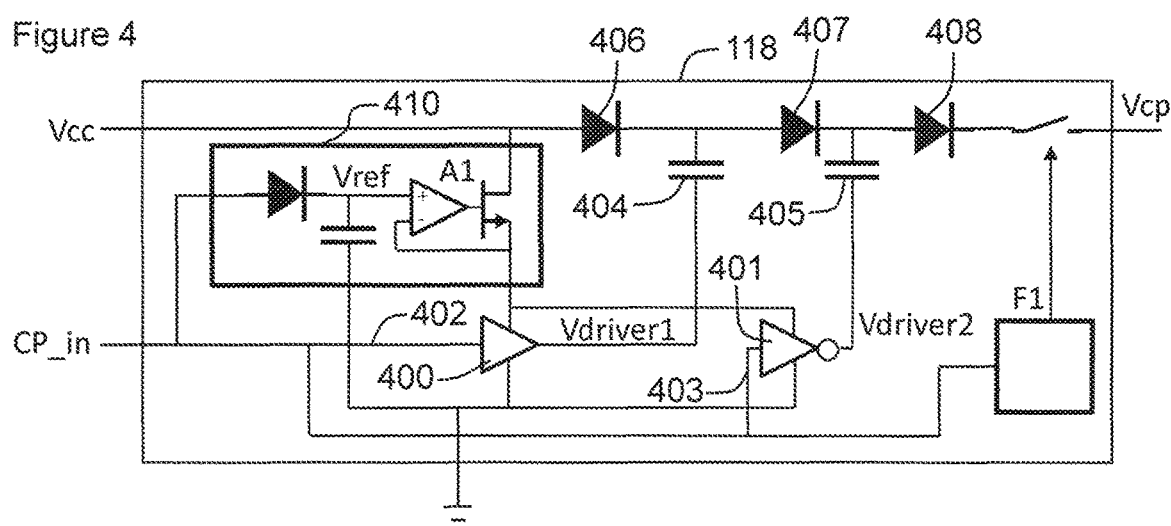
FIG. 4 shows a second example charge pump arrangement.

FIG. 4 shows a further example charge pump 118 comprising a two stage charge pump. In this example, the charge pump is substantially similar to that of FIG. 2, however, two driver amplifiers are provided: a first stage driver amplifier 400 and a second stage driver amplifier 401, each of the first and second driver amplifiers 400, 402 configured to receive the load connection signal CP_in at their respective inputs 402, 403 and provide an output to a respective capacitor 404, 405. The switch signal output arrangement of this example comprises a first diode 406, a second diode 407 and a third diode 406, all arranged in the same forward direction such that an anode of the first diode receives Vcc and the cathode of the third diode provides the switch signal. The capacitor 404 associated with the first driver amplifier 400 is connected to a node between the first and second diodes 406, 407. The capacitor 405 associated with the second driver amplifier 401 is connected to a node between the second and third diodes 407, 408. The output of the second driver amplifier 401 is configured to be inverted relative to the output of the first driver amplifier such that a voltage is output by each of the driver amplifiers alternately when the load connection signal is present. The voltage across the capacitors 404, 405, in combination with the controller supply voltage Vcc provides the switch signal. Both driver amplifiers 400, 403 are provided with power by a driver voltage supply block 410, which is substantially similar to the block 203, except for its output connecting to both of the driver amplifiers, and will not be described again here.

Figure 5:
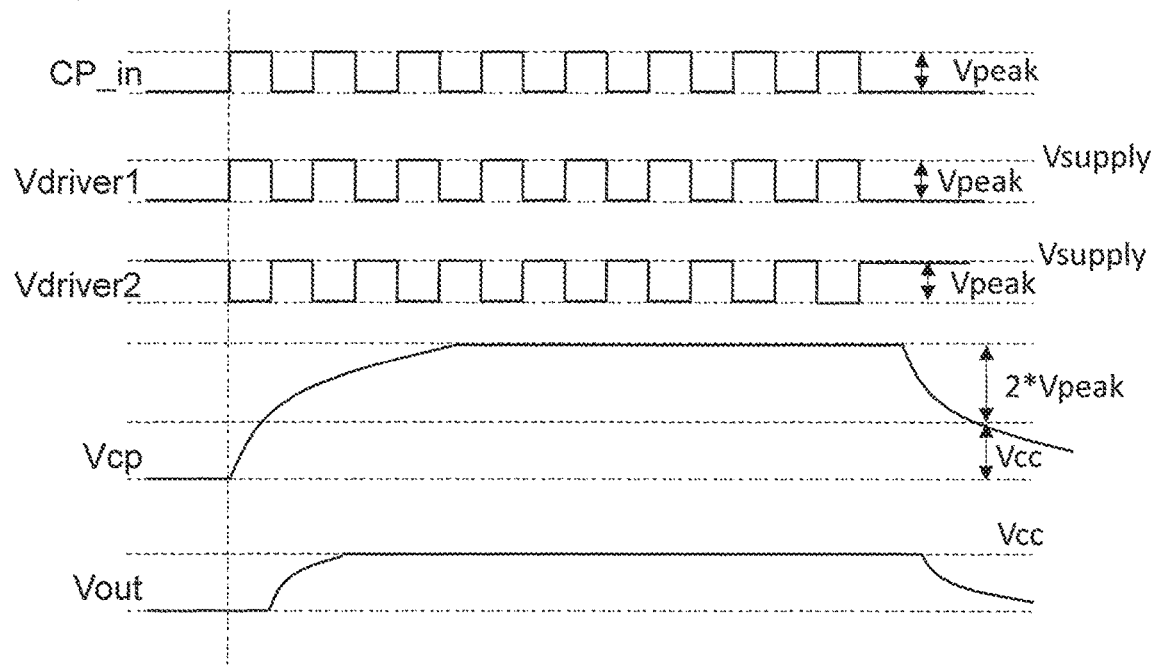
FIG. 5 shows a second timing diagram illustrating a plurality of signals of the charge pump of FIG. 4 on receipt of a load connection signal.

FIG. 5 shows an example timing diagram. This diagram differs from FIG. 3 in that the output from the first and second driver amplifiers 400, 401 is shown as Vdriver1 and Vdriver2. The pulses of Vdriver1 and Vdriver2 are 180° out of phase and transition between a reference voltage such as ground and Vsupply and have an amplitude of Vpeak. The switch signal accordingly has a maximum voltage approaching substantially Vcc=2*peak. A two stage charge pump may be advantageous over the single stage charge pump of FIG. 2 due to limitations in the voltage levels achievable by the integrated circuit or the performance of the NMOS load disconnection switch 102, for example.

Figure 6:
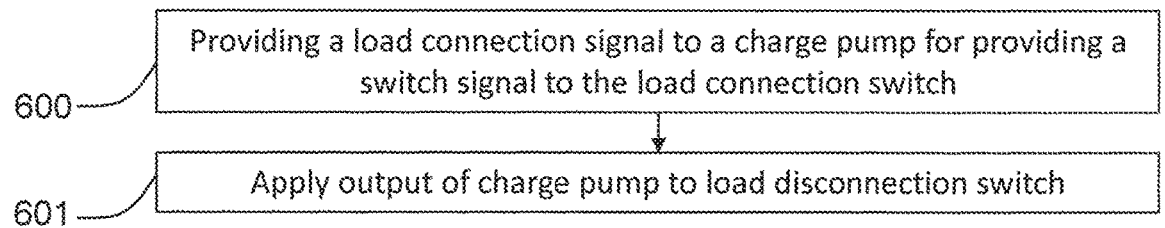
FIG. 6 shows a flowchart illustrating an example method.

FIG. 6 shows an example method of controlling the NMOS load connection switch 102 of a switched mode power supply 100, the load connection switch 102 configured to provide for connection or disconnection of an output 104 of the switched mode power supply 100 to a load connected to the switched mode power supply, comprising the step 600 of providing a load connection signal to a charge pump for providing a switch signal to the load connection switch, wherein the presence or absence of the load connection signal is configured to control whether or not the charge pump generates the switch signal and the amplitude of the load connection signal is configured to control the voltage of the switch signal. The output of the charge pump at step 601 is provided to control the load disconnection switch 102.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/ method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, Internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A secondary side controller for a switched mode power supply, the controller comprising
a first semiconductor die comprising an integrated circuit configured to provide a modulated load connection signal;
a second semiconductor die, packaged with the first semiconductor die, comprising a charge pump configured to, in response to the modulated load connection signal received from the integrated circuit of the first semiconductor die, provide a switch signal, based upon a presence or an absence of the modulated load connection signal, that controls a load connection switch configured to electrically connect the switched mode power supply to a load, wherein an amplitude of the modulated load connection signal is configured to control a voltage of the switch signal;

wherein the modulated load connection signal comprises a plurality of pulses and said plurality of pulses are configured to control the charging and discharging of at least one capacitor of the charge pump in order to provide the switch signal wherein the charge pump includes at least one driver amplifier having:
an input terminal configured to receive the modulated load connection signal;
wherein application of the modulated load connection signal at the input terminal is configured to charge and discharge the at least one capacitor;
an output terminal connected to the at least one capacitor; and
a power supply terminal;
wherein a driver supply voltage applied to the power supply terminal is based on the amplitude of the modulated load connection signal wherein the charge pump comprises a supply block configured to provide the driver supply voltage to the power supply terminal of the driver amplifier, the supply block further comprising:

a differential amplifier,
configured to receive the modulated load connection signal at its positive terminal and provide an output to a gate of a transistor, a source terminal and a drain terminal of the transistor connected to a supply voltage terminal; and
configured to receive a controller supply voltage provided to the controller and the power supply terminal of the driver amplifier respectively, a second power supply terminal of the driver amplifier connected to a reference voltage, a negative terminal of the differential amplifier connected to a node between the transistor and the driver amplifier.

2. The controller of claim 1, wherein the charge pump is configured to apply a voltage derived from the amplitude of the modulated load connection signal to the at least one capacitor in accordance with the plurality of pulses.

3. The controller of claim 1, wherein the charge pump is configured to receive a controller supply voltage and the switch signal comprises a voltage based on the controller supply voltage and a voltage across the at least one capacitor.

4. The controller of claim 1, wherein the charge pump includes:
at least a first stage driver amplifier and a second stage driver amplifier, each of the first and second driver amplifiers configured to receive the modulated load connection signal at their input and provide an output to a respective capacitor, the voltage across the capacitors, in combination with a controller supply voltage providing the switch signal, wherein the each of the first and second driver amplifiers are configured to receive a driver supply voltage and their respective power supply terminals derived from the modulated load connection signal.

5. The controller of claim 1, wherein the integrated circuit is configured to determine the amplitude of the modulated load connection signal based on the voltage output of the power supply.

6. The controller of claim 1, wherein the charge pump includes: an output arrangement configured to receive the voltage from the at least one capacitor and the controller supply voltage via a supply terminal and provide the switch signal at an output terminal of the controller, the output arrangement comprising
a first current control element, configured to connect to the controller supply voltage, and
a second current control element arranged in series, wherein the second current control element is configured to provide the switch signal, at least one capacitor is connected to a node between the first and second current control elements, and the first and second current control elements comprise diodes or switches configured to prevent current flow from the capacitor towards the supply terminal.

7. The controller of claim 1, wherein the integrated circuit of the first semiconductor die is configured to
control the application of the switch signal by provision of the modulated load connection signal, and
control the voltage of the switch signal by control of the amplitude of the modulated load connection signal in response to the voltage output of the switched mode power supply.

8. A switched mode power supply including:
a load disconnection switch at an output of the switched mode power supply and configured to provide for connection of the output of the switched mode power supply to the load, the load connection switch comprising an NMOS based transistor wherein a gate terminal thereof is connected to the secondary side controller of claim 1 and configured to receive the switch signal for control of the load connection switch.

9. A switched mode power supply according to claim 7, comprising:
a primary side and a secondary side connected by windings, wherein the secondary side controller is configured to provide a feedback signal to a primary side controller of the primary side for regulation of the voltage of the output of the switched mode power supply.

10. A Universal Serial Bus based charger configured to charge an electronic device including the switched mode power supply of claim 8.

* * * * *